United States Patent
Xu et al.

(10) Patent No.: US 10,224,268 B1
(45) Date of Patent: Mar. 5, 2019

(54) ENHANCED THERMAL TRANSFER IN A SEMICONDUCTOR STRUCTURE

(71) Applicant: CoolStar Technology, Inc., Sunnyvale, CA (US)

(72) Inventors: Shuming Xu, Sunnyvale, CA (US); Yi Zheng, Sunnyvale, CA (US)

(73) Assignee: COOLSTAR TECHNOLOGY, INC., Santa Clara, CA (US)

( * ) Notice: Subject to any disclaimer, the term of this patent is extended or adjusted under 35 U.S.C. 154(b) by 0 days.

(21) Appl. No.: 15/362,504

(22) Filed: Nov. 28, 2016

(51) Int. Cl.
    *H01L 23/495* (2006.01)
    *H01L 23/31* (2006.01)
    *H01L 21/48* (2006.01)

(52) U.S. Cl.
    CPC .... *H01L 23/49568* (2013.01); *H01L 21/4825* (2013.01); *H01L 21/4828* (2013.01); *H01L 21/4882* (2013.01); *H01L 23/3128* (2013.01); *H01L 23/49513* (2013.01); *H01L 23/49575* (2013.01)

(58) Field of Classification Search
    CPC ......... H01L 23/49568; H01L 23/49575; H01L 21/4825; H01L 21/4828; H01L 23/3128; H01L 23/49513
    See application file for complete search history.

(56) References Cited

U.S. PATENT DOCUMENTS

| | | |
|---|---|---|
| 6,096,656 A | 8/2000 | Matzke et al. |
| 6,184,064 B1 | 2/2001 | Jiang et al. |
| 6,607,928 B1 * | 8/2003 | Eiles .............. H01L 23/3677 257/E23.105 |
| 6,710,442 B1 * | 3/2004 | Lindgren ........... H01L 23/367 257/706 |
| 8,072,044 B2 | 12/2011 | Gruenhagen et al. |
| 8,222,118 B2 | 7/2012 | Dydyk et al. |
| 8,987,876 B2 * | 3/2015 | Gowda ............. H01L 23/3677 257/672 |
| 9,431,316 B2 * | 8/2016 | Pagaila ............. H01L 21/565 |
| 2003/0054953 A1 * | 3/2003 | He ..................... B01D 53/885 502/302 |
| 2003/0131973 A1 * | 7/2003 | Nair ..................... F28F 3/04 165/104.33 |
| 2004/0118579 A1 * | 6/2004 | McCutcheon ...... F28D 15/0241 174/16.3 |
| 2006/0131734 A1 * | 6/2006 | Kummerl ........... H01L 23/4334 257/706 |
| 2008/0075877 A1 * | 3/2008 | He ..................... B01D 53/885 427/446 |
| 2008/0135085 A1 * | 6/2008 | Corrales .............. H02S 20/23 136/246 |
| 2009/0195989 A1 * | 8/2009 | Oda ................. H01L 23/3677 361/709 |

(Continued)

*Primary Examiner* — Nathan W Ha
(74) *Attorney, Agent, or Firm* — Hoffman & Baron, LLP

(57) ABSTRACT

A semiconductor device having enhanced thermal transfer includes at least one die, including a device layer in which one or more functional circuit elements are formed and a substrate supporting the device layer, and a support structure. The die is disposed on the support structure using at least one connection structure coupled between the device layer and the support structure. A back surface of the substrate is textured so as to increase a surface area of the back surface to thereby enhance thermal transfer between the substrate and an external environment.

16 Claims, 11 Drawing Sheets

(56) References Cited

U.S. PATENT DOCUMENTS

| | | | |
|---|---|---|---|
| 2009/0316072 A1* | 12/2009 | Okumura | G02B 5/021 |
| | | | 349/64 |
| 2011/0132432 A1* | 6/2011 | Schultz | H01L 31/052 |
| | | | 136/246 |
| 2011/0297361 A1* | 12/2011 | Carbone | F28F 3/022 |
| | | | 165/185 |
| 2014/0015118 A1* | 1/2014 | Bae | H01L 23/3675 |
| | | | 257/713 |
| 2014/0264800 A1* | 9/2014 | Gowda | H01L 23/49568 |
| | | | 257/675 |
| 2017/0188481 A1* | 6/2017 | Kim | H05K 7/2029 |

* cited by examiner

ENHANCED THERMAL TRANSFER IN A SEMICONDUCTOR STRUCTURE

FIELD

The present invention relates generally to integrated circuit (IC) structures, and more particularly to semiconductor structures having enhanced thermal transfer, and methods of making same.

BACKGROUND

Semiconductor devices, particularly high-speed power semiconductor devices, generate heat during use. This heat must be removed in order to prevent further heating, performance degradation and/or consequent destruction of the device. Heat dissipation is therefore key to the reliability of any given semiconductor device.

There are various known methods for dissipating heat, also referred to as heat transfer, in a semiconductor device. Heat transfer involves the movement of heat from one point to another point due to a difference in temperature between the two points. Some of the primary mechanisms by which heat can be transferred from one region to another include conduction, which is a method of heat transfer wherein heat is exchanged between two elements that are situated in close proximity to one another, convection, which refers to heat transfer in a liquid or gas by the circulation or flow of the liquid or gas from one region to another, and radiation, which refers to heat transfer through electromagnetic heat exchange in the form of waves and rays.

Conventionally, heat dissipation in a semiconductor device is often achieved by using a heat sink or similar structure affixed to the outer package of the device. Heat sinks function by extending the surface area of heat dissipating surfaces through the use of fins, usually made out of metal with good thermal conductivity such as copper or aluminum. The fabrication methods can range from extruding, bonding, folding, die-casting, forging or skiving. This approach, however, requires that there be a good thermal bonding between the semiconductor device and heat sink which are often formed of different materials. Commonly used bonding methods are die attach, thermal grease, or thermal interface materials. Good performance die attach materials such as silver paste are expensive. In addition to the cost, the bonding materials inevitably introduce multiple interfaces in the thermal path between the die and the external system that impedes heat transfer and increases thermal resistance. The thermal contact resistance caused by imperfections at the interfaces, such as, for example, microvoids or contamination, often result in a significant increase in thermal resistance. Therefore, it is desirable to minimize the number of interfaces.

Modern electronic systems, particularly handheld devices, exert more constraints on heat dissipation of the semiconductor power devices. In these applications, the heat transfer is predominantly between power devices and the ambient air environment. However, cooling fans or conventional metal heat sinks are usually not practical for use in the system design due to battery power restrictions, among other constraints; moreover, these cooling devices cannot fit into the tight space allocated in the system. Therefore, forced convection as an effective heat transfer mechanism is not available, leaving natural convection and radiation as the only remaining viable options for heat dissipation.

SUMMARY

One or more embodiments of the present invention provide techniques for enhancing heat transfer in a semiconductor structure in a manner which does not add significant cost to the device or degrade the performance of the device.

In accordance with one embodiment, an exemplary semiconductor device having enhanced thermal transfer includes at least one die, including a device layer in which one or more functional circuit elements are formed and a substrate supporting the device layer, and a support structure. The die is disposed on the support structure using at least one connection structure coupled between the device layer and the support structure. A back surface of the substrate is textured so as to increase a surface area of the back surface to thereby enhance thermal transfer between the substrate and an external environment. In one or more embodiments, the texturing is achieved using periodic structures formed in or on the back side of the substrate and/or non-periodic structures formed in or on the back surface of the substrate.

In accordance with another embodiment, a method for fabricating a semiconductor device having enhanced thermal transfer includes: preparing a die including a device layer formed on a front side of a semiconductor substrate, the device layer including one or more functional circuit elements formed therein; attaching the die to a support structure such that the front side of the die is disposed on at least a portion of the support structure; and texturing a back side of the substrate so as to increase a surface area of the back side of the substrate to thereby enhance thermal transfer between the substrate and an external environment.

Techniques according to embodiments of the present invention provide substantial beneficial technical effects. By way of example only and without limitation, one or more embodiments provide techniques for improving thermal transfer in a semiconductor device having one or more of the following advantages, among other benefits:

- monolithic integrated heat sink formed on the back side of the silicon substrate without any additional materials;
- elimination of the need for die attach or thermal interface material;
- fabrication processes are compatible with standard front end CMOS and backend packaging processes, thus allowing performance enhancement and lower processing cost;
- integral heat sink enhances conduction (monolithic Si structure), convection (larger surface area) and radiation (large surface emissivity), making it particularly advantageous for natural convection applications;
- small form factor is especially advantageous in space-constrained applications where there is no room for cooling fan or large metal heat sinks, hence natural convection and radiation becomes the only heat transfer paths for heat dissipation from power devices to ambient air;
- many types of structures and dimensions offer the possibility of optimizing surface emissivities and microstructures according to various heat fluxes and ambient environments to thereby maximize thermal performance.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1A:
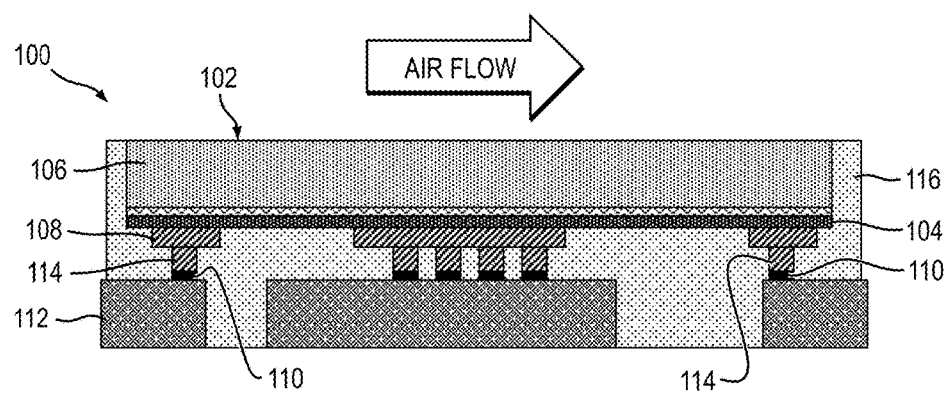
FIG. 1A is a cross-sectional view depicting at least a portion of a packaged semiconductor device which conceptually illustrates a heat transfer mechanism.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative semiconductor devices, and methods of forming such devices, that are fabricated having a textured back surface designed to improve thermal dissipation in the device. It is to be appreciated, however, that the invention is not limited to the specific methods and/or devices illustratively shown and described herein. Rather, aspects of the present disclosure relate more broadly to techniques for providing enhanced thermal transfer in a semiconductor structure. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

Although the overall fabrication method and structures formed thereby, as will be described in further detail herein below, are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are hereby incorporated by reference herein. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) and/or region(s) not explicitly shown are omitted in the actual integrated circuit device.

As previously stated, semiconductor devices, particularly high-speed power semiconductor devices, generate heat during their use which must be removed in order to prevent performance degradation and/or consequent failure of the device. In the case of an encapsulated die, heat transfer is typically accomplished by providing a thermal conduction path between the die and the device package. In a flip-chip device arrangement, however, where the active surface of the die generating a predominate portion of the heat is not proximate to an external wall of the package, heat must be conducted through a substrate of the device, which is generally encapsulated by a molding compound that exhibits poor thermal conduction.

FIG. 1A is a cross-sectional view depicting at least a portion of a packaged semiconductor device 100 which conceptually illustrates a heat transfer mechanism in the device. The device 100 includes a semiconductor die 102 having an upper surface 104 in which active devices and other circuit elements are formed on a semiconductor substrate 106. The die 102, in this embodiment, is flipped upside down, in a flip-chip arrangement, such that conductive pads 108 (e.g., solder bumps) formed on the upper surface 104 of the die are in alignment with and electrically connected to corresponding bonding sites 110 on a package lead frame 112 or substrate by way of conductive pillars 114, or alternative connection structures (e.g., solder balls, etc.). An encapsulant 116 (e.g., epoxy resin) surrounds the die 102 to provide mechanical stability and environmental protection to the device 100.

Figure 1B:
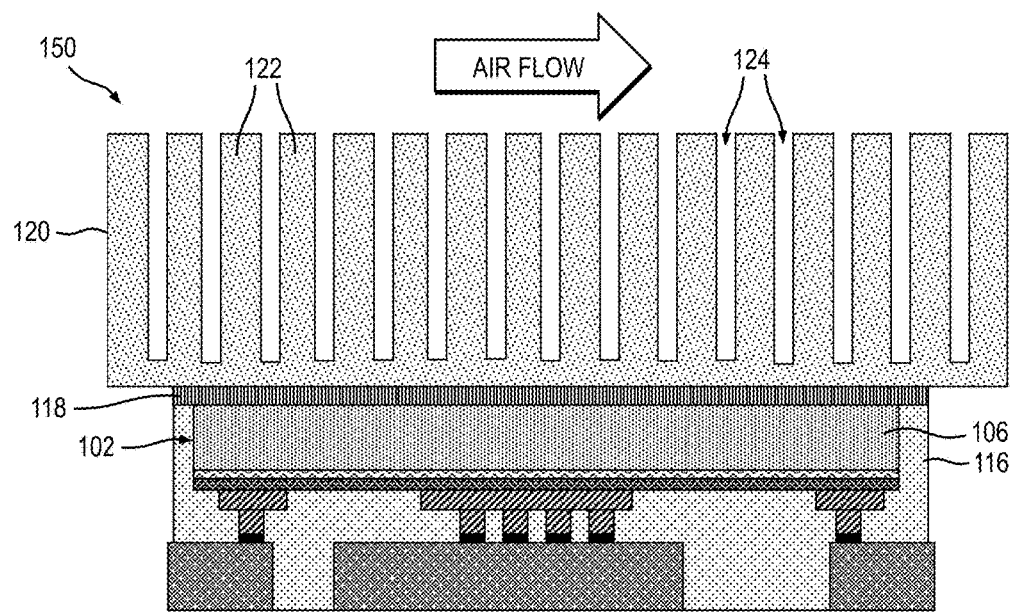
FIG. 1B is a cross-sectional view depicting at least a portion of a packaged semiconductor device which conceptually illustrates an alternative heat transfer mechanism.

FIG. 1B is a cross-sectional view depicting at least a portion of a packaged semiconductor device 150 which conceptually illustrates an alternative heat transfer mechanism. In this embodiment, the device 150 is essentially the same as the device 100 shown in FIG. 1A, with the addition of a thermal interface material (TIM) 118 attached by physical pressure or sometimes soldering on the exposed back side of the die substrate 106 and on the surrounding encapsulant 116, and a heat sink 120 attached to the thermal interface material, such as, for example, using a silicone pad, die attach paste, or the like. The thermal interface material 118 is preferably formed of material having a high thermal conductivity (e.g., 0.8-15 watts per meter per Kelvin (W/m·K)) and functions to facilitate heat transfer between the back side of the die 102 and the heat sink 120. The heat sink 120 is preferably formed of a conductive material (e.g., copper, aluminum, etc.) having a plurality of fins 122 with openings 124 between adjacent fingers. The fins 122 help increase a surface area of the heat sink 120 exposed to the external environment so as to help radiate heat as air flows across the device 150.

In the device arrangement shown in FIG. 1A, the thermal conduction path through the back side molding compound of the package to ambient air has high thermal resistance for transferring heat away from the active devices in the die (e.g., by air flowing across the device 100); the substrate 106, being typically comprised of silicon, as well as the encapsulant 116, being typically comprised of injection-molded plastic, have a very low thermal conductivity. Although attaching a heat sink to the back side of the die, as illustrated by the device 150 shown in FIG. 1B, can improve thermal transfer in the device, the need for a thermal interface material, heat sink and attachment means significantly increases the cost and complexity of this approach. Moreover, in many space-constrained applications, there is no room for metal heat sinks.

Aspects of the present invention address one or more problems of removing heat in a semiconductor device by beneficially providing an additional thermal conduction path through an exposed back side of the die. More particularly, in accordance with one or more embodiments, a back surface of the substrate is textured so as to increase a surface area of the portion of substrate exposed to the environment. Since silicon, of which the device substrate is typically comprised, is a good thermal conductor (e.g., thermal conductivity of silicon is about 130-140 W/m·K), this increased surface area on the back side of the die allows for enhanced thermal transfer between the die and the external environment as air flows across the device; that is, aspects of the invention provide an additional thermal path for heat generated by functional circuit elements on the upper surface of the die to be dissipated through the substrate to the exposed back surface of the die, with enhancement in both convection (forced or natural) and radiation, without added thickness to the overall package.

Figure 2:
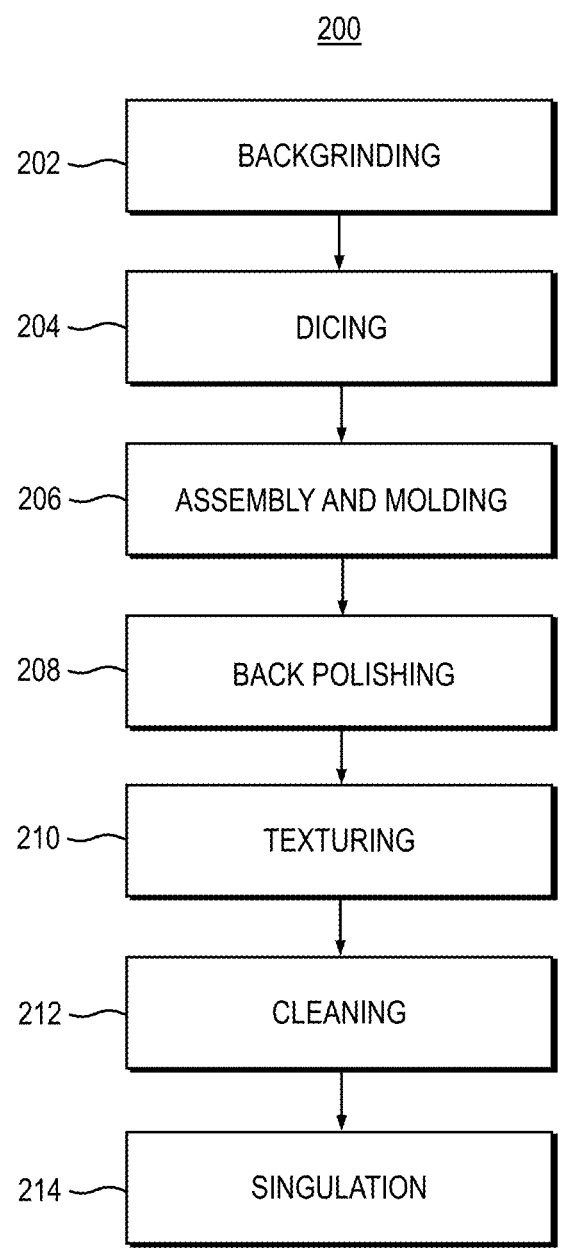
FIG. 2 depicts at least a portion of an exemplary method for fabricating a semiconductor device having enhanced thermal transfer, according to an embodiment of the invention.

FIG. 2 depicts at least a portion of an exemplary method 200 for fabricating a semiconductor device having enhanced thermal transfer, according to an embodiment of the invention. The method 200 presumes that all functional circuit elements (e.g., transistors, resistors, metal routing, etc.) have already been fabricated on a front side of a semiconductor wafer. Subsequently, backgrinding is performed from a back side of the wafer in step 202 during which wafer thickness is reduced to allow for stacking and high density integrated circuit (IC) packaging. The wafer is then diced in step 204 to separate individual die from the wafer following the processing of the wafer.

In step 206, the separated die is assembled to a lead frame. In one or more embodiments, the die is turned upside-down and mounted to the lead frame in a flip-chip configuration, also referred to as controlled collapse chip connection (C4). Specifically, in flip-chip assembly, solder bumps are deposited on pads formed on the upper surface of the wafer during a final wafer processing step. In order to mount the chip to external circuitry (e.g., a circuit board or another chip or wafer), the die is flipped over so that its upper surface faces down, and the die is arranged so that its pads align with corresponding pads on the external circuit or lead frame. The solder is then reflowed to complete the interconnect. This is in contrast to wire bonding, in which the chip is mounted upright and wires are used to interconnect the chip pads to the lead frame. Once the die has been assembled to the lead frame, an encapsulating material is deposited over the assembled structure during a molding process in step 206. The encapsulant (e.g., epoxy resin, injection molded thermoplastic, etc.) surrounds the die to provide mechanical stability and environmental protection to the semiconductor device.

In step 208, back grinding is performed to thereby expose a back surface of the die. To accomplish this, a portion of the upper surface of the encapsulated device (proximate the back surface of the die) is removed, such as by grinding, etc., until the back surface of the die is visible. Texturing of the back surface of the die is then performed in step 210 to beneficially increase the surface area of the exposed die and thereby improve heat transfer in the device. Embodiments of the invention contemplate various ways of texturing the back surface of the die, including forming periodic structures, such as, for example, fingers or columns, pyramids, inverted pyramids, etc., non-periodic (i.e., random) structures, such as, for example, chemical isotexturing, plasma or laser texturing, etc., or a combination of periodic and non-periodic texturing, as will be described in further detail herein below.

After texturing of the back surface of the wafer has been completed, the back surface is cleaned in step 212, such as by performing an etching process (e.g., wet/chemical etching), or an alternative cleaning step, to remove residual chemical etchant from the wafer surface and also to remove defects in the semiconductor surface. In step 214, singulation is performed, usually by a diamond saw, to dice the wafer into individual dies.

Figure 3:
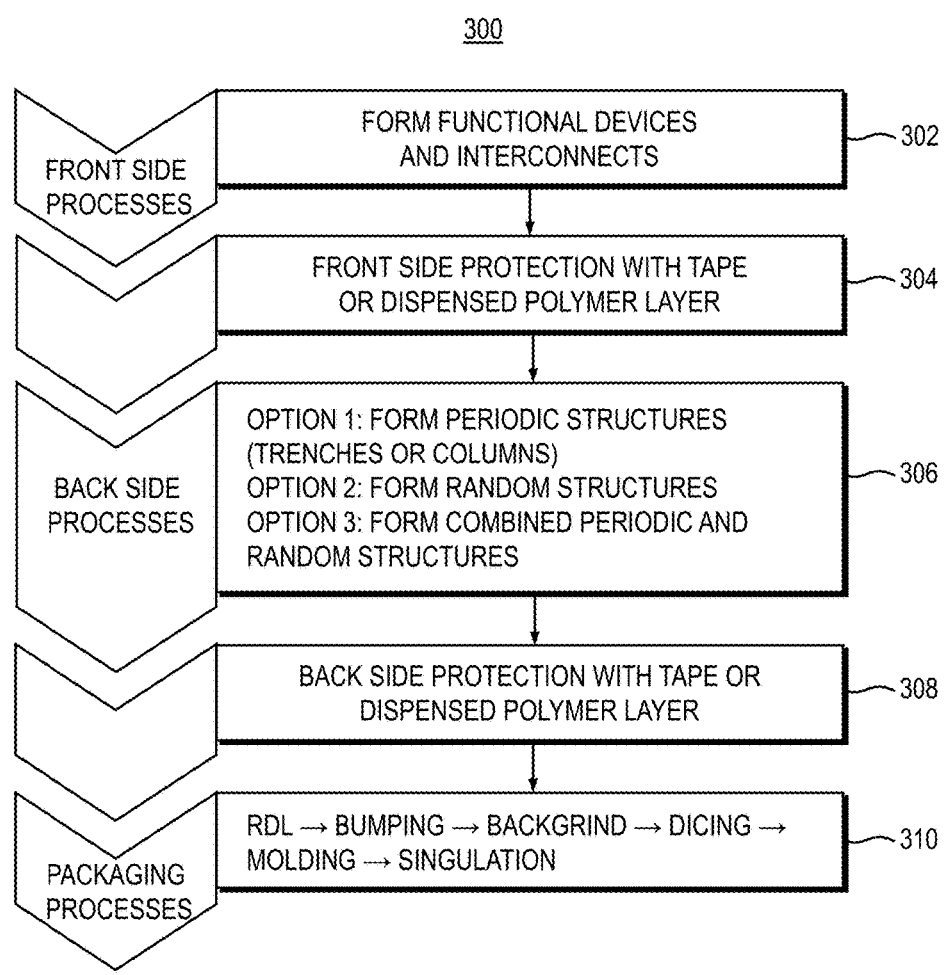
FIG. 3 conceptually depicts at least a portion of an exemplary method for fabricating a semiconductor device having enhanced thermal transfer wherein method steps are grouped into one or more front side processes, back side processes, and packaging processes, according to an embodiment of the invention.

FIG. 3 conceptually depicts at least a portion of an exemplary method 300 for fabricating a semiconductor device having enhanced thermal transfer, according to an embodiment of the invention. The method 300 includes a plurality of steps organized into one or more front side (i.e., front end) processes, back side (i.e., back end) processes, and packaging processes. More particularly, the method 300 comprises front side processes including the formation of functional devices, circuit elements and interconnects in an active layer (e.g., upper surface) of the wafer in step 302, and the protection of the front side of the wafer using, for example, tape or a dispensed polymer layer in step 304 following the formation of the functional circuit elements.

The method 300 further comprises back side processes which, in this illustrative embodiment, are performed subsequent to the front side processes to avoid the high temperatures typically required for front end processing which are generally not compatible with back end processing. Back side processes, in one or more embodiments, involve texturing the back side of the wafer in step 306, including: (i) forming periodic structures, such as, for example, fingers or columns, pyramids, inverted pyramids, etc.; (ii) forming non-periodic (i.e., random) structures, such as, for example, chemical isotexturing, plasma or laser texturing, etc.; or (iii)

forming a combination of periodic and non-periodic structures, as previously stated. Once back side processing has been completed, the back side of the wafer is protected in step 308 using, for example, tape or a dispensed polymer layer.

Next, the method 300 performs packaging processes in step 310 comprising, for example, redistribution layer (RDL) formation, containing conductive metal lines introduced to reroute connections on the wafer/die surface, solder bumping, backgrinding, wafer dicing, to separate individual die from the wafer, molding (to encapsulate the whole device structure and metal layers by plastic molding compound to protect the device from moisture and to improve reliability) and singulation.

Figure 4:
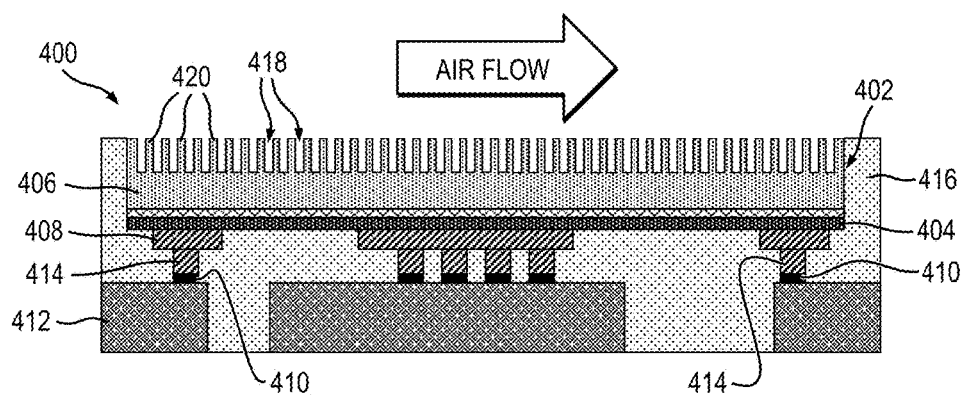
FIG. 4 is a cross-sectional view depicting at least a portion of an exemplary semiconductor device having enhanced thermal transfer characteristics, according to an embodiment of the invention.

By way of illustration only and without limitation, FIG. 4 is a cross-sectional view depicting at least a portion of an exemplary semiconductor device 400 having enhanced thermal transfer characteristics, according to an embodiment of the invention. The device 400 comprises a semiconductor die 402 having an upper surface 404, which may be referred to herein as a device layer, in which active devices and other functional circuit elements are formed on a semiconductor substrate 406. The substrate 406, in one or more embodiments, is formed of single-crystalline silicon (e.g., having a <100> or <111> crystal orientation). Suitable alternative materials for forming the substrate 406 may also be used, such as, but not limited to, germanium, silicon germanium, silicon carbide, gallium arsenide, gallium nitride, or the like. Additionally, in one or more embodiments the substrate 406 may be modified by adding an impurity or dopant (e.g., boron, phosphorus, arsenic, etc.) to change a conductivity of the material (e.g., n-type or p-type) as desired. In one or more embodiments, a conductive material (e.g., metal) may be added to the substrate 406 to form an electrically conductive surface while enhancing the thermal conductivity of the substrate. Alternatively, or in addition, one or more conductive structures (not explicitly shown, but implied) may be formed through the substrate, each providing a heat transfer path between the upper surface 404 and the exposed substrate 406.

In this embodiment, the die 402 is configured in a flip-chip arrangement (i.e., turned upside down), such that conductive pads 408 (e.g., solder bumps) formed on the upper surface 404 of the die are in alignment with and electrically connected to corresponding bonding sites 410 on a package lead frame 412 or other support structure (e.g., substrate) by way of conductive pillars 414, or alternative connection structures (e.g., solder balls, conductive vias, etc.). An encapsulant 416 or other molding compound (e.g., epoxy resin) surrounds the die 402 to provide mechanical stability and environmental protection for the device 400.

In accordance with one or more embodiments of the invention, a back surface of the substrate 406 is textured so as to increase a surface area of the portion of substrate exposed to the environment. This increased surface area allows for enhanced thermal transfer between the device 400 and the external environment as air flows across the device.

For example, in the illustrative embodiment shown in FIG. 4, a back surface of the substrate 406 is formed having a plurality of trenches 418, or alternative features (e.g., grooves). The portion of substrate material remaining between adjacent trenches (mesas) forms a plurality of periodic fingered structures or columns 420 configured to increase the surface area of the exposed substrate. The trenches 418 may be formed, in one or more embodiments, using standard lithographic patterning and etching, such as, for example, wet etching, reactive ion etching (RIE), or the like, although the methodology used to form the periodic structures 420 is not critical. The formation of fingered structures 420 in the back side of the substrate 406 increases the surface area available for thermal transfer by about two to 100 times, depending upon the aspect ratio of the trenches 418. The higher the aspect ratio of the trenches (i.e., ratio of trench depth to trench width), the greater will be the increase in surface area of the exposed periodic structures 420 formed in the substrate 406. It is to be appreciated that, in contrast to the conventional approach of adding heat sink to the outside of the die, this embodiment does not add any thickness to the device, as the heat sink is advantageously formed within the device substrate.

Thus, one or more embodiments beneficially provide an additional thermal conduction path through the back side of the die for removing heat from the device. This is especially advantageous where thermal transfer through the upper surface of the die (i.e., where circuit elements are formed) is poor, such as, for example, in the case of devices utilizing wire bonding.

Figure 5:
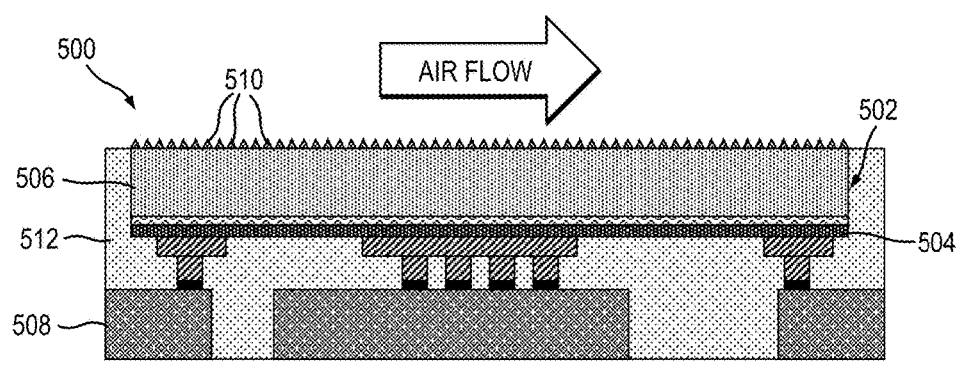
FIG. 5 is a cross-sectional view depicting at least a portion of an exemplary semiconductor device comprising pyramid structures configured to enhance thermal transfer in the device, according to an embodiment of the invention.

With reference now to FIG. 5, a cross-sectional view depicts at least a portion of an exemplary semiconductor device 500 comprising pyramid structures configured to enhance thermal transfer in the device, according to an embodiment of the invention. The device 500, like the illustrative device 400 shown in FIG. 4, includes a die 502 having an upper surface 504, also referred to herein as a device layer, in which functional circuit elements are formed on a semiconductor substrate 506. The die 502 is configured in a flip-chip connection arrangement, such that the upper surface 504 is facing downward and connected to a lead frame 508 or other support structure, and a back side of the substrate 506 forms at least a portion of an upper surface of the device 500. An encapsulant 512 or other molding compound (e.g., epoxy resin) surrounds the die 502 to provide mechanical stability and environmental protection to the device 500. The back side of the substrate is exposed to the environment through an opening in the encapsulant 512.

In the device 500, back side texturing is achieved by forming a plurality of periodic pyramid structures 510 on the back surface of the substrate 506. Like the fingered structures 420 in the device 400 of FIG. 4, the pyramid structures 510 function to beneficially increase a surface area of the back surface of the substrate 506, which thereby enhances thermal transfer in the device 500. The pyramid structures 510 may be formed using standard lithographic patterning and etching, such as, for example, wet etching, reactive ion etching (RIE), or the like. It is to be appreciated, however, that the material and/or methodology used to form the pyramid structures 510 is not critical.

The formation of the pyramid structures 510 on the back side of the substrate 506 increases the surface area available for thermal transfer by about 1.7 to 100 times, depending on the aspect ratio (height vs. width) of the pyramid structures. The higher the aspect ratio, the greater will be the increase in surface area of the pyramid structures 510 formed on the substrate 506, and thus the greater the thermal transfer in the device 500.

Figure 6:
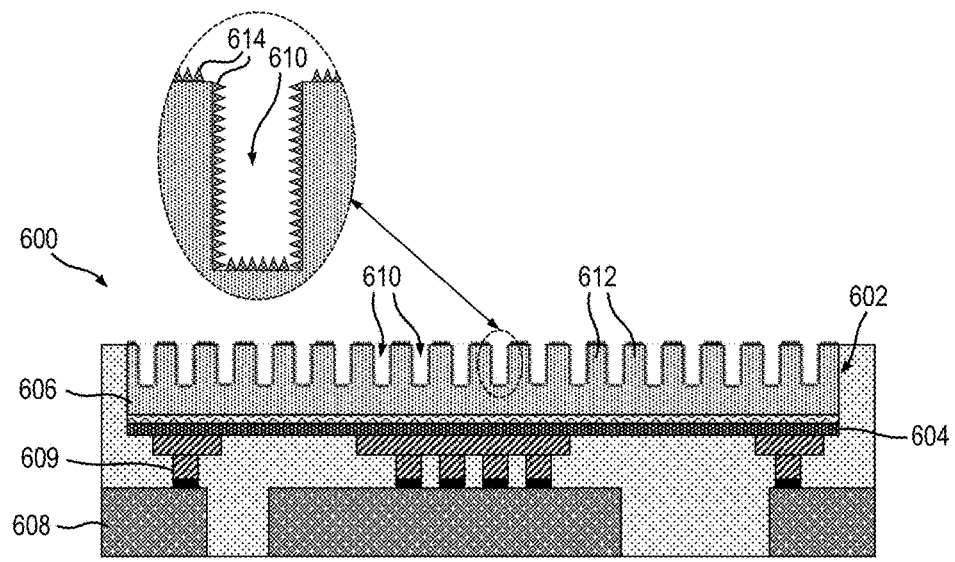
FIG. 6 is a cross-sectional view depicting at least a portion of an exemplary semiconductor device having enhanced thermal transfer characteristics for both convection and radiation, according to an embodiment of the invention.

FIG. 6 is a cross-sectional view depicting at least a portion of an exemplary semiconductor device having enhanced thermal transfer characteristics for both convection and radiation, according to another embodiment of the invention. The device 600 combines aspects of devices 400 and 500 shown in FIGS. 4 and 5, respectively. Specifically, device 600 comprises a semiconductor die 602 having an upper surface 604, which may be referred to herein as a device layer, in which active devices and other functional circuit elements are disposed on a semiconductor substrate 606. The die 602 is configured in a flip-chip connection arrangement, such that the upper surface 604 is facing downward and disposed on a lead frame 608 or other support structure, and a back side of the substrate 606 is exposed to the external environment through an upper surface of the device 600. In this embodiment, like in the illustrative embodiments shown in FIGS. 4 and 5, conductive pads formed on the upper surface 604 of the die are electrically connected to corresponding bonding sites on the lead frame 608 by way of conductive structures 609 (e.g., conductive pillars, vias, solder balls, etc.).

In the device 600, a plurality of trenches 610, or alternative features (e.g., grooves), are formed in the back surface of the substrate 606. The portion of substrate material remaining between adjacent trenches forms a plurality of periodic fingered structures or columns 612 (i.e., mesa structures) configured to increase the surface area of the exposed substrate. The trenches 610 may be formed, in one or more embodiments, using standard lithographic patterning and etching, such as, for example, wet etching, RIE, or the like. The formation of fingered structures 612 in the back side of the substrate 606 increases the surface area available for thermal transfer by about two to 100 times, depending upon the aspect ratio of the trenches 610. The higher the aspect ratio of the trenches (i.e., ratio of trench depth to trench width), the greater will be the increase in surface area of the exposed periodic structures 612 formed in the substrate 606.

In order to achieve higher emissivity for enhanced radiation heat transfer in the device 600, a plurality of pyramid structures 614 are formed on sidewalls and/or a bottom of each of at least a subset of the trenches 610. The high emissivity can be achieved, for example, through microtexturing of the surface (sidewalls and/or bottom) of the trenches 610 by either chemical, pulsed laser, or plasma dry etch methods or the like, in one or more embodiments. The amount of radiation in the device 600 can be controlled, at least in part, as a function of the number, shape and/or dimensions of the pyramid structures 614. It is to be understood that although shown in this example as being pyramidal in shape, the structures 614 disposed on the sidewalls and/or bottom of the trenches 610 may be formed in other shapes, such as, but not limited to, trapezoidal, spherical, etc., similarly configured to increase heat transfer in the device 600 primarily via surface emissivity, as will become apparent to those skilled in the art given the teachings herein.

Figure 7:
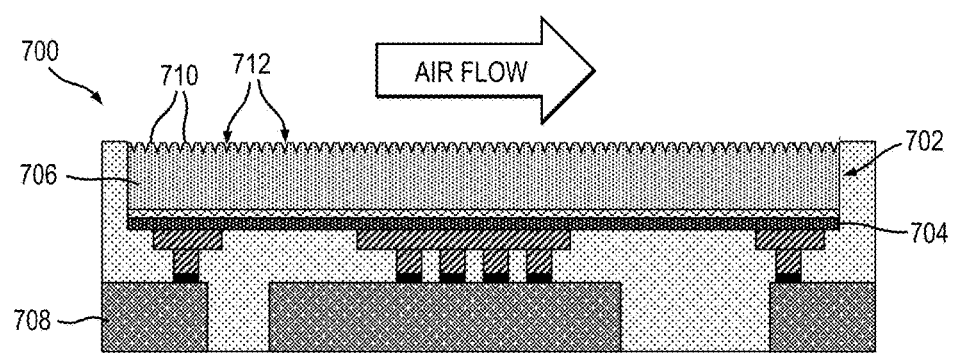
FIG. 7 is a cross-sectional view depicting at least a portion of an exemplary semiconductor device comprising inverted pyramid structures configured to enhance thermal transfer in the device, according to an embodiment of the invention.

FIG. 7 is a cross-sectional view depicting at least a portion of an exemplary semiconductor device 700 comprising inverted pyramid structures configured to enhance thermal transfer in the device, according to an embodiment of the invention. The device 700, like the illustrative devices 400 and 500 shown in FIGS. 4 and 5, respectively, includes a die 702 having an upper surface 704, also referred to as a device layer, in which functional circuit elements are formed on a semiconductor substrate 706. The die 702 is configured in a flip-chip connection arrangement, such that the upper surface 704 is facing downward and connected to a lead frame 708, and a back side of the substrate 706 is exposed through an upper surface of the device 700.

In the device 700, back side texturing is achieved by forming a plurality of periodic inverted pyramid structures 710 in the back surface of the substrate 706. Like the fingered structures 420 in the device 400 of FIG. 4, the inverted pyramid structures 710 function to beneficially increase a surface area of the back surface of the substrate 706, which thereby enhances thermal transfer in the device 700. The inverted pyramid structures 710, in one or more embodiments, may be formed using standard lithographic patterning and etching, such as, for example, wet etching, ME, or the like. For example, periodic v-shaped channels or grooves 712 may be etched into the substrate 706, with the remaining substrate material between adjacent v-shaped grooves forming pyramid structures below an upper planar surface of the device 700. It is to be appreciated, however, that the methodology used to form the inverted pyramid structures 710 is not critical.

The formation of the inverted pyramid structures 710 in the back side of the substrate 706 increases the surface area available for thermal transfer by about 1.5 to 5 times, depending on the aspect ratio (depth vs. width) of the v-shaped grooves 712. The higher the aspect ratio, the greater will be the increase in surface area of the inverted pyramid structures 710 formed in the substrate 706, and thus the greater the thermal transfer in the device 700.

Figure 8:
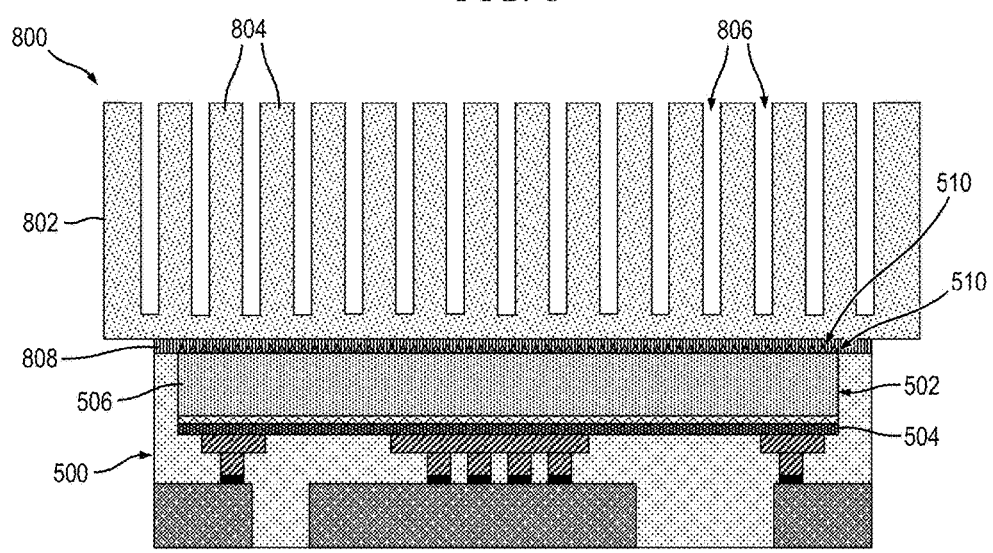
FIG. 8 is a cross-sectional view depicting at least a portion of an exemplary semiconductor device having enhanced thermal transfer and including a heat sink, according to an embodiment of the invention.

Aspects of the present invention, in one or more embodiments thereof, may be combined with a heat sink to further enhance the thermal transfer characteristics of the device. By way of illustration only and without limitation, FIG. 8 is a cross-sectional view depicting at least a portion of an exemplary semiconductor device 800 having enhanced thermal transfer and including a heat sink, according to an embodiment of the invention. Specifically, with reference to FIG. 8, the device 800 incorporates a heat sink 802, or other thermal distribution structure (e.g., integrated heat spreader (IHS)), with the exemplary semiconductor device 500 shown in FIG. 5, which utilizes pyramid structures 510 formed on the back surface of the substrate 506 to implement back side texturing, to further increase the heat transfer capabilities of the device. It is to be appreciated that the heat sink 802, in one or more embodiments, may be employed in conjunction with any of the back side texturing techniques within the scope of the invention, including those back side texturing embodiments described herein.

The heat sink 802, in one or more embodiments, may be formed in a manner consistent with the heat sink 120 shown in FIG. 1B. More particularly, the heat sink 802 is preferably formed of a conductive material (e.g., copper, aluminum, etc.) having a plurality of fingers 804 with openings 806 between adjacent fingers. The fingers 804 help increase a surface area of the heat sink 802 exposed to the external environment so as to help radiate heat as air flows across the device 800. A thermal conductivity of the material used to form the heat sink 802 is preferably high, such as for example, copper of about 400 W/m·K, although embodiments of the invention are not limited to any specific thermal conductivity. Embodiments of the invention contemplate numerous configurations (e.g., fingered, dimpled, flat, etc.), dimensions and/or materials (e.g., copper, aluminum, etc.) for forming the heat sink 802, as will become apparent to those skilled in the art given the teachings herein.

A thermal interface material 808 is disposed on at least a portion of the back side of the die 502, between the back side of the die and the heat sink 802. The textured surface of the back side of the die, implemented in this embodiment using the pyramid structures 510, provides increased contact area between the heat sink 802 and the thermal interface material 808 so as to facilitate enhanced heat transfer in the device 800. This is particularly beneficial for use with a new type of the thermal interface material; namely, phase change material (PCM). Phase change thermal materials change from solid at room temperature to liquid when heated, which has a higher thermal transfer rate than most other TIM materials. However, one challenge of a PCM is the "flow away" problem. The microstructures on the textured back side can act like many tiny reservoirs for the PCM to keep the material from flowing away.

Figure 9:
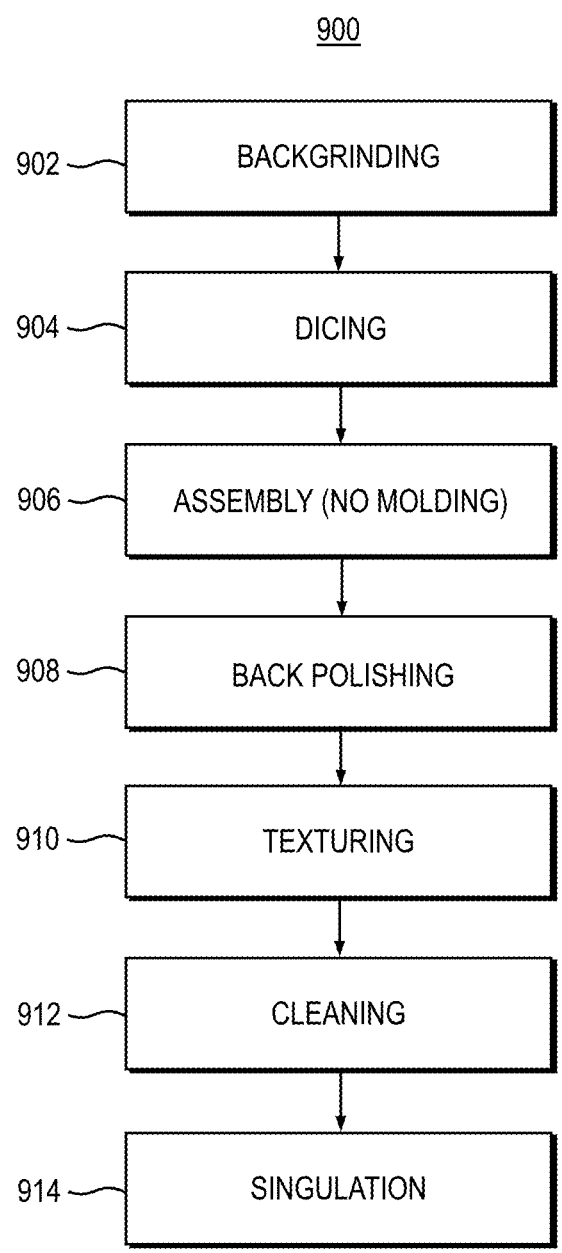
FIG. 9 is flow diagram depicting an exemplary method for fabricating a semiconductor device having enhanced thermal transfer characteristics, according to an embodiment of the invention.

One or more aspects in accordance with embodiments of the invention utilize an open lead frame and/or open die structure to facilitate enhanced heat transfer through increased natural convection through the open lead frame/open die structure. In this embodiment, molding/encapsulation processing need not be performed. FIG. 9 is flow diagram depicting an exemplary method 900 for fabricating a semiconductor device having enhanced thermal transfer characteristics, according to an embodiment of the invention. The method 900 is consistent with the illustrative method 200 shown in FIG. 2, except for the elimination of a molding/encapsulation step.

Specifically, with reference to FIG. 9, once all functional circuit elements have been fabricated on a semiconductor wafer, backgrinding is performed from a back side of the wafer in step 902 during which wafer thickness is reduced. The wafer is then diced in step 904 to separate individual die from the wafer following the processing of the wafer. In step 906, the separated die is assembled to a lead frame. In one or more embodiments, the die is turned upside-down and mounted to the lead frame in a flip-chip configuration. In the method 200 shown in FIG. 2, once the die has been assembled to the lead frame, an encapsulating material is deposited over the assembled structure during a molding process to provide mechanical stability and environmental protection to the semiconductor device. In method 900, however, no molding/encapsulation process is performed, leaving the lead frame open to facilitate natural convection cooling. The remaining steps in method 900, including back polishing in step 908, texturing in step 910, cleaning in step 912 and singulation in step 914, are consistent with the corresponding steps previously described in conjunction with FIG. 2.

As previously stated, encapsulation provides mechanical support and environmental protection to the packaged die. During normal operation, however, the temperature of the device will be higher than ambient temperature. Accordingly, moisture condensation will not be of concern. Moreover, since silicon inherently has a relatively high thermal conductivity (e.g., about 130-140 W/m·K), embodiments of the invention do not require thinning of the wafer, and thus a thicker die can be used having sufficient mechanical stability, without relying the molding material for support. Another advantage achieved by removing the molding process is that the device will be free from mechanical stresses otherwise caused by mismatches in the coefficient of thermal expansion (CTE) between the molding compound and the metal lead frame (e.g., copper), and between the molding compound and silicon die.

Figure 10:
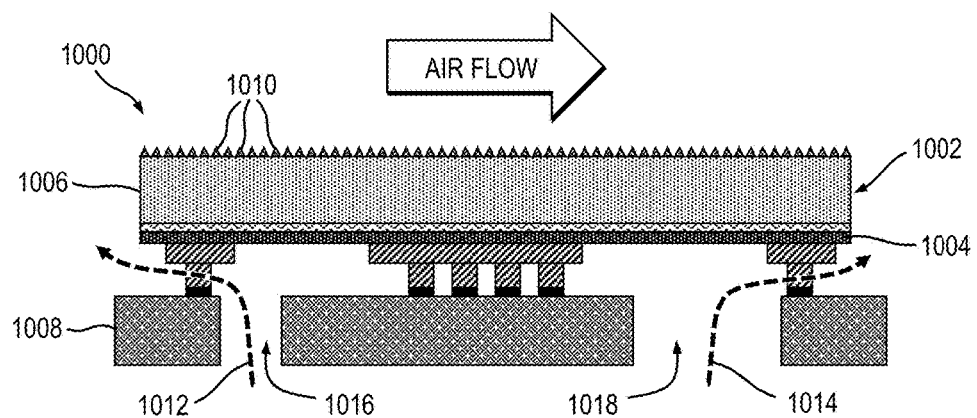
FIG. 10 is a cross-sectional view depicting at least a portion of an exemplary semiconductor device having enhanced thermal transfer characteristics and an open lead frame, according to an embodiment of the invention.

FIG. 10 is a cross-sectional view depicting at least a portion of an exemplary semiconductor device 1000 having enhanced thermal transfer characteristics and an open lead frame, according to an embodiment of the invention. The device 1000, like the illustrative device 500 shown in FIG. 5, includes a die 1002 having an upper surface 1004, which may be referred to herein as a device layer, in which functional circuit elements are formed on a semiconductor substrate 1006. The die 1002 is configured in a flip-chip connection arrangement, such that the upper surface 1004 is facing downward and connected to a lead frame 1008, and a back side of the substrate 1006 forms at least a portion of an upper surface of the device 1000.

In the device 1000, back side texturing is achieved by forming a plurality of periodic pyramid structures 1010 on the back surface of the substrate 1006. The pyramid structures 1010 function to beneficially increase a surface area of the back surface of the substrate 1006, which thereby enhances thermal transfer in the device 1000. In a manner consistent with the pyramid structures 510 in the device 500 of FIG. 5, the pyramid structures 1010, in one or more embodiments, are formed of the same material used to form the substrate 1006 (e.g., silicon); alternatively, the pyramid structures may comprise a material other than that used to form the substrate. The pyramid structures 1010 may be formed using standard lithographic patterning and etching, such as, for example, wet etching, RIE, or the like. It is to be appreciated, however, that the material and/or methodology used to form the pyramid structures 1010 is not critical.

Certain benefits can be achieved by removing the encapsulation/molding material from the semiconductor device. Thus, according to one or more embodiments, the device 1000 utilizes an open lead frame design whereby the molding compound (e.g., encapsulant 512 in FIG. 5) is eliminated. This embodiment allows natural convection cooling, as represented by air paths 1012 and 1014, through openings 1016 and 1018, respectively, in the lead frame 1008. Traditionally, the disadvantages associated with not using a molding compound included the formation of moisture on a device layer of the die and/or reduced mechanical stability, which can impact the reliability of the device. As previously explained, however, during normal operation, the die will be at a higher temperature relative to ambient air temperature, and therefore moisture condensation will not form on the die. Furthermore, since embodiments of the invention exploit the high thermal conductivity of the silicon substrate to transfer heat away from the functional circuit elements in the device layer 1004 of the die 1002, the substrate need not be thinned to the point that mechanical stability is compromised, as in conventional power devices. Accordingly, the additional support provided by a molding compound is not necessary. The elimination of the encapsulation step further simplifies the device fabrication process, which translates into reduced cost.

Figure 11:
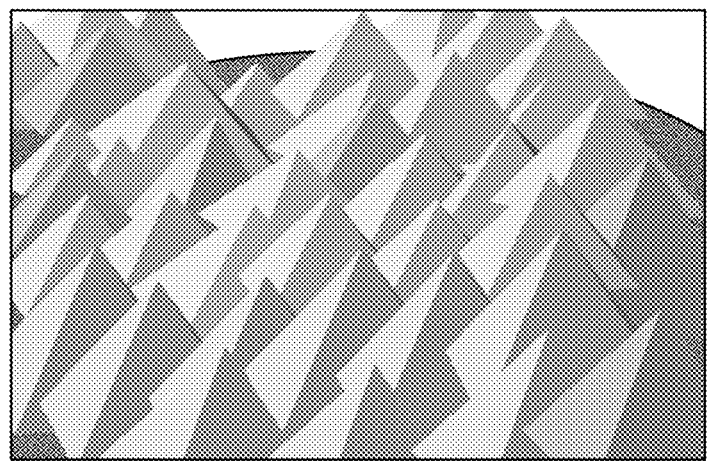
FIGS. 11 through 15B depict at least a portion of the back side of illustrative semiconductor devices employing different forms of texturing, according to embodiments of the invention.
Figure 12:
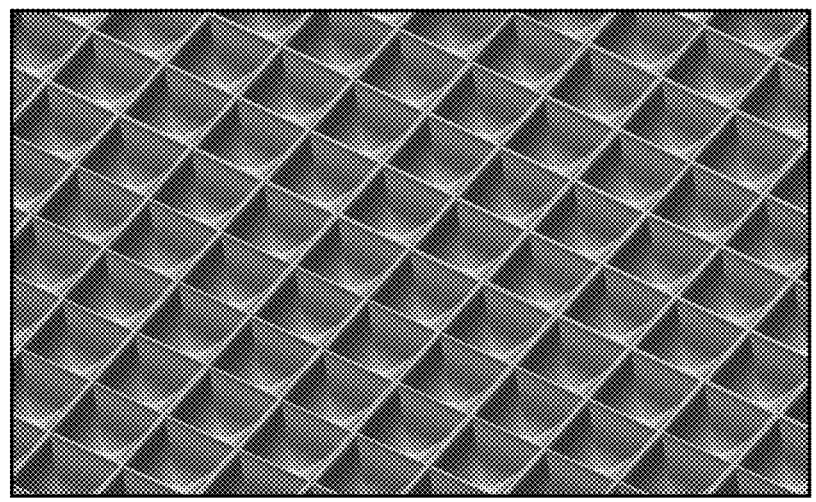
Figure 13:
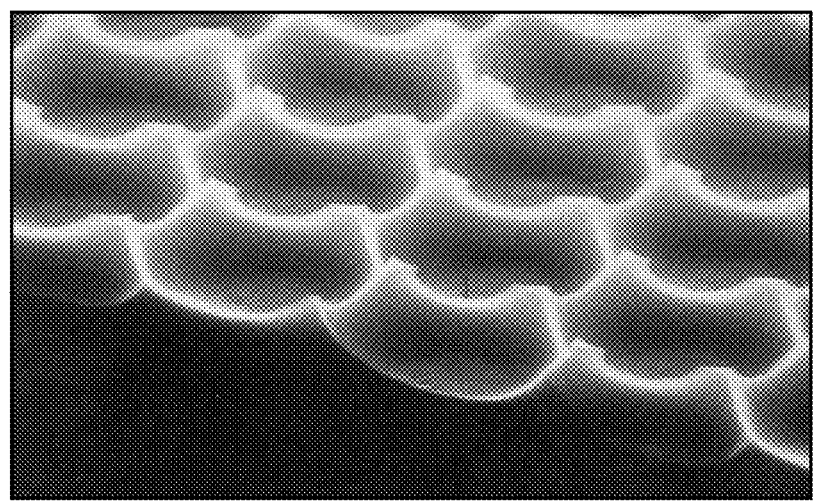
Figure 14A:
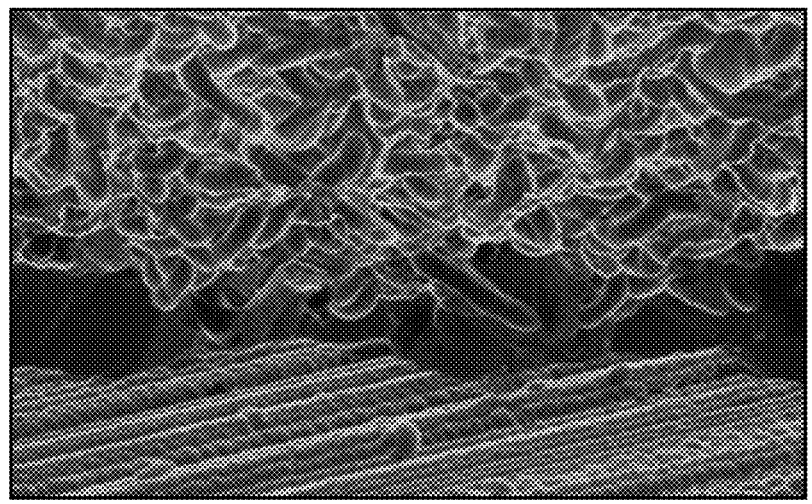
Figure 14B:
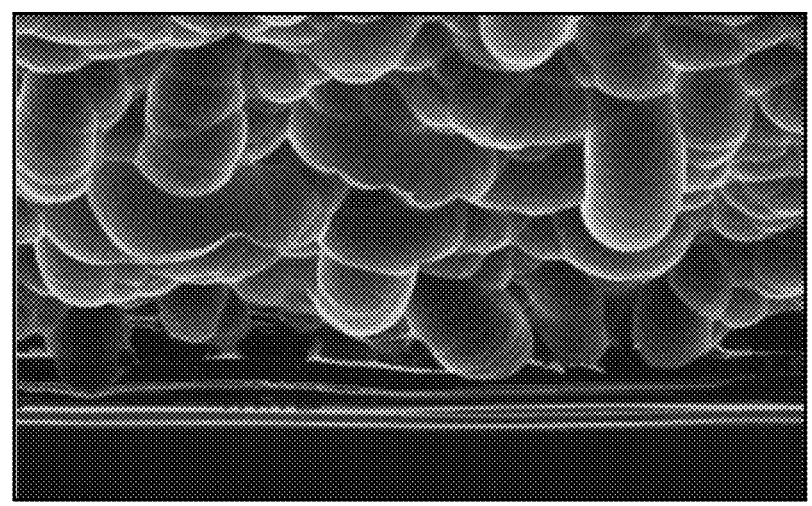
Figure 15A:
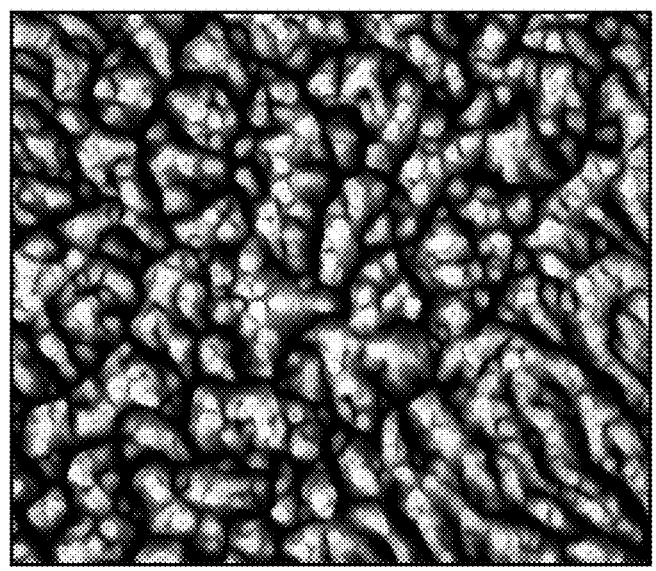
Figure 15B:
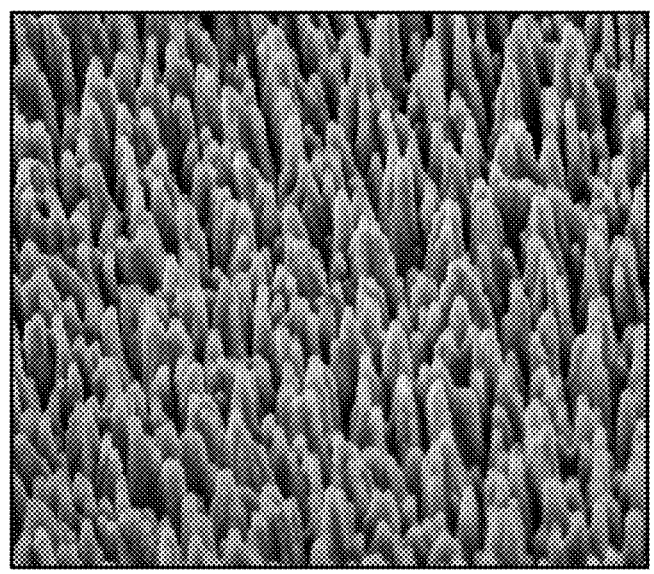

FIGS. 11 through 15B are scanning electron micrographs (SEMs) depicting at least a portion of the back side of illustrative semiconductor devices employing different forms of texturing, according to embodiments of the invention. Specifically, FIG. 11 depicts the back surface of a substrate of a semiconductor device which has been textured by exposing the back surface of the substrate to a potassium hydroxide (KOH) solution. As apparent from FIG. 11, the resulting structures are non-periodic and provide about a 2 to 10 times increase in surface area. FIG. 12 depicts the back surface of a substrate of a semiconductor device that has been textured using a two-step texturing process, where two different wet etch chemistries are used to form more complex structures, such as nanostructures on the micro-textured surface, for forming a plurality of periodic pyramid structures on the back side of the die. This texturing approach provides an increase in surface area of about 1.5 to 5 times. FIGS. 13, 14A and 14B depict the back surface of a substrate of a semiconductor device which has been textured by exposing the back surface of the substrate to a nitric acid (HNO$_3$) solution; each of the figures shows different magnifications, with FIG. 14B having the highest magnification and FIG. 13 having the lowest magnification. As apparent from FIG. 13, the resulting isotextured structures are periodic. This texturing approach provides an increase in surface area of about 2 to 10 times. FIGS. 15A and 15B depict the back surface of a substrate of a semiconductor device which has been textured by a plasma or laser texturing process to form non-periodic (e.g., random) structures configured to increase the surface area of the back side of the die. Plasma or laser texturing, in one or more embodiments, provides an increase in surface area of about 10 to 100 times.

Given the discussion thus far, it will be appreciated that an exemplary semiconductor device having enhanced thermal transfer includes at least one die (e.g., 402 in FIG. 4), including a device layer (e.g., 404 in FIG. 4) in which one or more functional circuit elements are formed and a substrate (e.g., 406 in FIG. 4) supporting the device layer, and a support structure (e.g., 412 in FIG. 4). The die is disposed on the support structure using at least one connection structure (e.g., 414 in FIG. 4) coupled between the device layer and the support structure. A back surface of the substrate is textured so as to increase a surface area of the back surface, to thereby enhance thermal transfer between the substrate and an external environment. In one or more embodiments, the texturing is achieved using periodic structures formed in or on the back surface of the substrate and/or non-periodic structures formed in or on the back surface of the substrate.

Given the discussion thus far, it will also be appreciated that a method for fabricating a semiconductor device having enhanced thermal transfer includes: preparing a die including a device layer formed on a front side of a semiconductor substrate, the device layer including one or more functional circuit elements formed therein; attaching the die to a support structure such that the front side of the die is disposed on at least a portion of the support structure; and texturing a back side of the substrate so as to increase a surface area of the back side of the substrate to thereby enhance thermal transfer between the substrate and an external environment. In one or more embodiments, texturing the back surface of the substrate is achieved by forming periodic structures in or on the back side of the substrate and/or forming non-periodic structures in or on the back side of the substrate.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having active semiconductor devices integrated with passive components in accordance with one or more embodiments of the invention.

An integrated circuit in accordance with aspects of the present disclosure can be employed in essentially any application and/or electronic system where high-frequency power semiconductor devices (e.g., RF power amplifiers) are employed. Suitable systems and devices for implementing embodiments of the invention may include, but are not limited to, portable electronics (e.g., cell phones, tablet computers, etc.). Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "upper," "lower" and "back" are used to indicate relative positioning of elements or structures to each other when such elements are oriented in a particular manner, as opposed to defining absolute positioning of the elements.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A semiconductor device having enhanced thermal transfer, the semiconductor device comprising:
   a support structure;
   at least one die comprising a device layer in which one or more functional circuit elements are formed and a substrate supporting the device layer, the at least one die being disposed on the support structure using at least one connection structure coupled between the device layer and the support structure, wherein a back surface of the substrate is textured so as to increase a surface area of the back surface to thereby enhance thermal transfer between the substrate and an external environment;
   a plurality of trenches formed in the back surface of the substrate, a portion of the substrate remaining between adjacent trenches forming periodic fingered structures, a surface area of the back surface being controlled as a function of an aspect ratio of the fingered structures; and
   a plurality of pyramid structures formed on at least one of sidewalls and a bottom of each of at least a subset of the trenches, the pyramid structures increasing a surface emissivity of the semiconductor device.

2. The semiconductor device of claim 1, wherein at least one of sidewalls and a bottom of each of at least a subset of the trenches is micro-textured for increasing a surface emissivity of the semiconductor device.

3. The semiconductor device of claim 1, wherein at least a subset of the pyramid structures are comprised of a different material than the substrate.

4. A semiconductor device having enhanced thermal transfer, the semiconductor device comprising:
   a support structure;
   at least one die comprising a device layer in which one or more functional circuit elements are formed and a substrate supporting the device layer, the at least one die being disposed on the support structure using at least one connection structure coupled between the device layer and the support structure, wherein a back surface of the substrate is textured so as to increase a surface area of the back surface to thereby enhance thermal transfer between the substrate and an external environment; and
   a plurality of periodic inverted pyramid structures formed in the back surface of the substrate, a surface area of the back surface of the substrate being controlled as a function of an aspect ratio of the inverted pyramid structures.

5. A semiconductor device having enhanced thermal transfer, the semiconductor device comprising:
   a support structure;
   at least one die comprising a device layer in which one or more functional circuit elements are formed and a substrate supporting the device layer, the at least one die being disposed on the support structure using at least one connection structure coupled between the device layer and the support structure, wherein a back surface of the substrate is textured so as to increase a surface area of the back surface to thereby enhance thermal transfer between the substrate and an external environment; and
   a plurality of periodic pyramid structures formed on the back surface of the substrate and protruding vertically therefrom, a surface area of the back surface of the substrate being controlled as a function of an aspect ratio of the pyramid structures.

6. The semiconductor device of claim 5, wherein the pyramid structures are comprised of a different material than the substrate.

7. A semiconductor device having enhanced thermal transfer, the semiconductor device comprising:
   a support structure;
   at least one die comprising a device layer in which one or more functional circuit elements are formed and a substrate supporting the device layer, the at least one die being disposed on the support structure using at least one connection structure coupled between the device layer and the support structure, wherein a back surface of the substrate is textured so as to increase a surface area of the back surface to thereby enhance thermal transfer between the substrate and an external environment; and
   a plurality of non-periodic structures formed at least one of in and on the back surface of the substrate, the non-periodic structures increasing a surface emissivity of the semiconductor device.

8. The semiconductor device of claim 7, wherein the support structure comprises a lead frame configured to receive the die, the die being attached to the lead frame in a flip-chip connection arrangement.

9. The semiconductor device of claim 8, further comprising a plurality of connection structures electrically connecting first conductive sites formed on the upper surface of the die with corresponding second conductive sites disposed on the lead frame.

10. The semiconductor device of claim 8, wherein the lead frame comprises at least one opening therein, the opening providing an air path through the lead frame for increasing natural convection cooling in the semiconductor device.

11. The semiconductor device of claim 7, further comprising an encapsulant surrounding the at least one die, the encapsulant configured to provide mechanical stability and environmental protection for the device, the back surface of the substrate being exposed to the environment through an opening formed in the encapsulant.

12. The semiconductor device of claim 11, wherein the textured back surface of the substrate of the at least one die is substantially planar with an upper surface of the encapsulant.

13. The semiconductor device of claim 7, further comprising a plurality of periodic structures formed in or on the back surface of the substrate.

14. A semiconductor device having enhanced thermal transfer, the semiconductor device comprising:
  a support structure;
  at least one die comprising a device layer in which one or more functional circuit elements are formed and a substrate supporting the device layer, the at least one die being disposed on the support structure using at least one connection structure coupled between the device layer and the support structure, wherein a back surface of the substrate is textured so as to increase a surface area of the back surface to thereby enhance thermal transfer between the substrate and an external environment;
  a thermal interface material disposed on at least a portion of the back surface of the substrate; and
  a thermal distribution structure disposed on an upper surface of the thermal interface material.

15. The semiconductor device of claim 14, wherein the thermal interface material comprises a phase change material.

16. The semiconductor device of claim 15, further comprising a plurality of microstructures formed on the back surface of the substrate, the microstructures being configured as reservoirs to prevent the phase change material from flowing away when the phase change material is in a liquid phase.

* * * * *